United States Patent [19]
Bozovic et al.

[11] Patent Number: 5,264,413
[45] Date of Patent: Nov. 23, 1993

[54] BI-SR-CA-CU-O COMPOUNDS AND METHODS

[76] Inventors: Ivan Bozovic, 181 Lois La., Palo Alto, Calif. 94303; James N. Eckstein, 11261 Catalina Ct., Cupertino, Calif. 95014

[21] Appl. No.: 825,738

[22] Filed: Jan. 27, 1992

Related U.S. Application Data

[63] Continuation of Ser. No. 489,075, Mar. 7, 1990, abandoned.

[51] Int. Cl.$^5$ .................. C01F 11/02; C01G 3/02; C01G 29/00; H01L 39/12
[52] U.S. Cl. ........................ 505/1; 252/518; 252/521; 505/782
[58] Field of Search ............ 505/1, 782; 252/521, 252/518

[56] References Cited

U.S. PATENT DOCUMENTS

| | | | |
|---|---|---|---|
| 4,861,750 | 8/1989 | Nogawa et al. | 505/1 |
| 4,880,771 | 11/1989 | Cava et al. | 505/1 |

FOREIGN PATENT DOCUMENTS

| | | | |
|---|---|---|---|
| 0321184 | 6/1989 | European Pat. Off. | 505/782 |
| 0336621 | 10/1989 | European Pat. Off. | |
| 0126224 | 5/1989 | Japan | 505/782 |
| 0008929 | 9/1989 | PCT Int'l Appl. | 505/782 |

OTHER PUBLICATIONS

Adachi "Superconducting Properties in a Bi-Sr-Ca-Cu-O System" *Jap. Jnl. Appl. Phys.* vol. 27(3) Mar. 1988 pp. L344-L346.
Inoue "Superconductive Transition at 120K in a . . . " *Jap. Jnl. Appl. Physics* vol. 28(7) Jul. 1989 pp. L1167-L1170.
Soeta "Relationship between Crystal Structures and Solid . . . " *Jap. Jnl. Appl. Phys.* vol. 28(7) Jul. 1989 pp. L1186-L1189.
Wheatley "Interlayer Effects in High-Tc Superconductors" *Nature* vol. 333 May 12, 1988 p. 121.
Meyer "Reactivity and Passivation for Bi Adatoms . . . " *Appl. Phys. Lett.* vol. 53(11) Sep. 11, 1988 pp. 1004-1006.
Braun "Constitution and Synthesis of High-Tc Superconductors" *Physica C* vol. 153-5 Dec. 1988 pp. 499-500.
Sunshine "Structure and Physical Properties of Single Crystals . . . " *Phys. Rev. B* vol. 38(1) Jul. 1, 1988 pp. 893-896.
Subramanian "A New High-Temperature Superconductor $Bi_2Sr_{3-x}Ca_8Cu_2O_x$" *Science* vol. 239 Feb. 28, 1988 pp. 1015-1018.
Hetherington "High-Resolution Electron Microscopy of the . . . " *Appl. Phys. Lett* vol. 53(11) Sep. 12, 1988 pp. 1016-1018.
Cheetham "Control of Copper Valence in $Bi_2Sr_{2-x}CaCu_2O_8$" *Nature* vol. 333 May 5, 1988 pp. 21-22.
Wang "Production and Characterization of . . . $Bi_2Sr_2CaCu_2O_x$" *Solid State Comm.* vol. 69(8) 1989 pp. 829-832.
Rao "Effect of Chemical Substition and Oxide Additives . . . " *Phase Transition* vol. 19 Dec. 1989 pp. 191-199.

(List continued on next page.)

*Primary Examiner*—Paul Lieberman
*Assistant Examiner*—John Boyd
*Attorney, Agent, or Firm*—Allan M. Lowe

[57] ABSTRACT

Compounds of the formula $Bi_1Sr_2Ca_{n-1}Cu_nO_{2n+3+x}$ wherein n is a positive integer and x is less than 1 are formed by molecular beam epitaxial deposition of a plurality of atomic layers on a substrate in the following composition sequence:

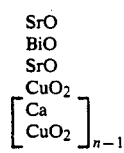

9 Claims, 1 Drawing Sheet

OTHER PUBLICATIONS

Wang "Preparation and Superconductivity of . . . $Bi_2CaSr_{2-x}Ba_xCa_2O_8$" *Jnl. Chin. Chem. Soc.* vol. 36 1989 pp. 205–210.

Wu et al, *Physical Review Letters*, vol. 58, No. 9, pp. 908–910 (1987).

Hor et al, *Physical Review Letters*, vol. 58, No. 9, pp. 911–912 (1987).

Moodenbaugh et al, *Physical Review Letters*, vol. 58, No. 18, pp. 1885–1887 (1987).

Murphy et al, *Physical Review Letters*, vol. 58, No. 18, pp. 1889–1990 (1987).

Hor et al, *Physical Review Letters*, vol. 58, No. 18, pp. 1891–1894 (1987).

Tarascon et al, *Physical Review B*, vol. 38, No. 13, pp. 8885–8892 (1988).

Chakoumakos et al, *Journal of Materials Research*, vol. 4, No. 4, p. 767 (1989).

Scholom et al, *Proceedings of MRS Meeting*, Boston, 1989 and article accepted for publication in *Journal of Crystal Growth*.

Eckstein et al, *Proceedings of the International Superconductivity Electronics Conference*, Tokyo 1989.

Nakayama et al, *Proceedings of the International Superconductivity Electronics Conference*, Tokyo, 1989.

Fujita et al, *Applied Physics Letters*, vol. 56, Nos. 3, pp. 295–297 (Jan. 15, 1990).

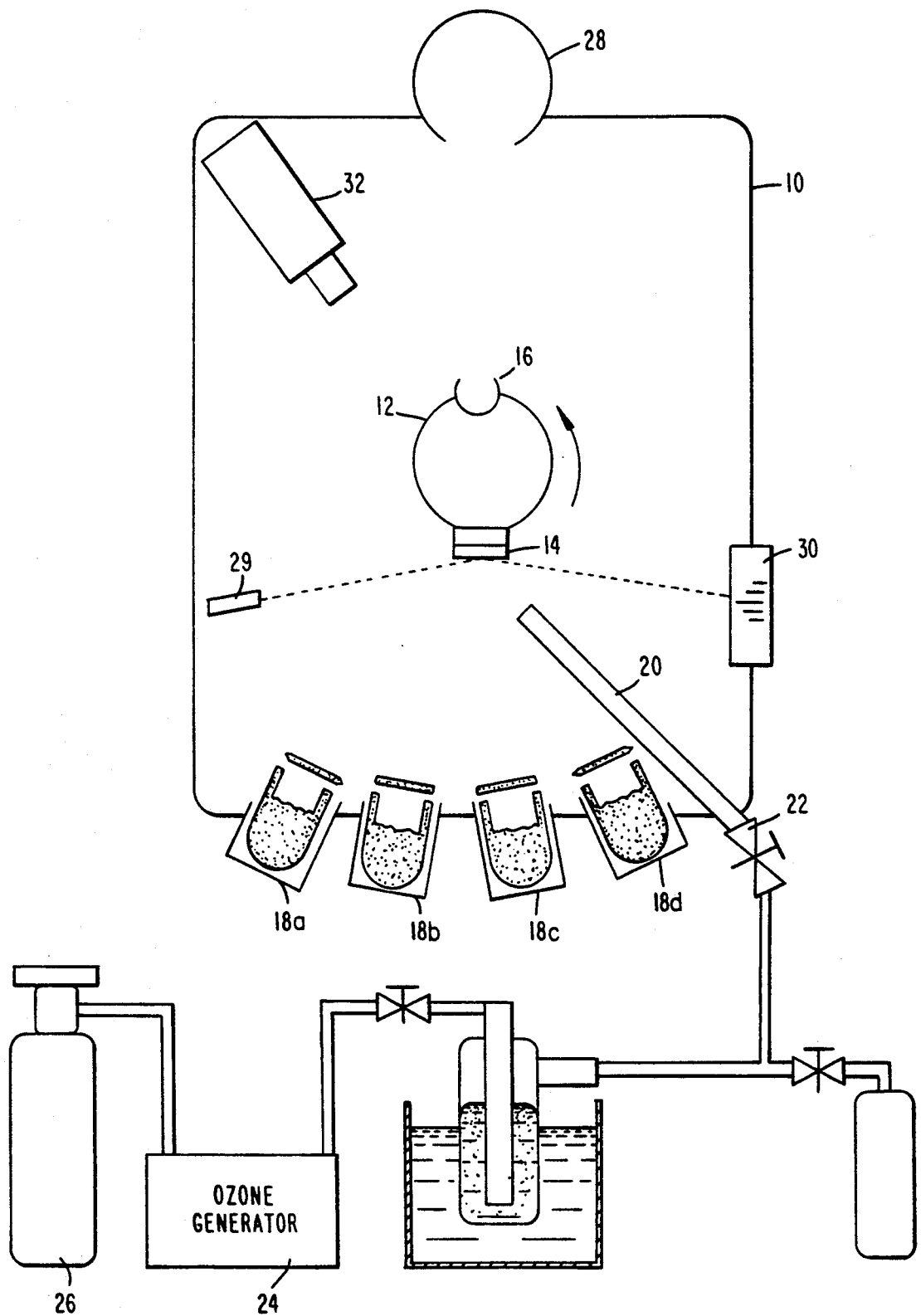

BI-SR-CA-CU-O COMPOUNDS AND METHODS

This application is a continuation of application Ser. No. 07/489,075 filed Mar. 7, 1990 now abn.

FIELD OF THE INVENTION

The present Invention relates to Bi-Sr-Ca-Cu—O compounds of the formula $Bi_1Sr_2Ca_{n-1}Cu_nO_{2n+3+x}$ wherein n is a positive integer and x is less than 1. The present Invention also relates to methods for forming such compounds by molecular beam epitaxy.

BACKGROUND OF THE INVENTION

High temperature superconducting (HTSC) compounds including mixed oxides of rare earth, alkaline earth and copper metals are known. For example, Wu et al., *Physical Review Letters*, Vol. 58, No. 9, pp. 908–910 (1987) and Hor et al., *Physical Review Letters*, Vol. 58, No. 9, pp. 911–912 (1987) have disclosed Y-Ba-Cu-O compound systems as exhibiting superconductivity. Additionally, in *Physical Review Letters*, Vol. 58, No. 18 (1987), Moodenbaugh et al. (pp. 1885–1887), Murphy et al. (pp. 1889–1890) and Hor et al. (pp. 1891–1894) disclose additional rare earth, alkaline earth, copper metal mixed oxide compounds exhibiting superconductive properties. Generally, these references disclose the formation of the rare earth, alkaline earth, copper metal mixed oxide compounds by sintering individual oxide powders.

Additional superconducting mixed metal oxide compounds of La-Sr-Cu—O, Bi-Sr-Ca-Cu—O and Tl-Ba-Ca-Cu—O have also been developed. For example, Tarascon et al., *Physical Review B*, Vol. 38, No. 13, pp. 8885–8892 (1988) disclose Bi-Sr-Ca-Cu—O superconducting compounds of the formula $Bi_2Sr_2Ca_{n-1}Cu_nO_y$ wherein $n = 1, 2$ or $3$ which are prepared by firing at high temperatures stoichiometric amounts of $Bi_2O_3$, $SrCO_3$ or $SrO_2$, and CuO powders. Similarly, Chakoumakos et al., *Journal of Materials Research*, Vol. 4, No. 4, p. 767 (1989), have disclosed the preparation of Br-Sr-Cu—O compounds, particularly $Bi_2Sr_2CuO_6$ using ceramic processing and melt crystallization techniques.

Schlom et al., *Proceedings of MRS Meeting*, Boston, 1989, and article accepted for publication in *Journal of Crystal Growth*, have disclosed Bi-Sr-Ca-Cu—O compounds of the formula $Bi_2Sr_2Ca_{n-1}Cu_nO_x$ wherein n is from 1 to 5 which are formed by molecular beam epitaxy of layered structures. Eckstein et al., *Proceedings of the International Superconductivity Electronics Conference*, Tokyo, 1989, have also disclosed the formation of thin films of perovskite-related high-temperature superconductors using atomic layer molecular beam epitaxy. The preparation of superconducting compounds of the formula $Bi_2Sr_2Ca_{n-1}Cu_nO_y$ is further disclosed by Nakayama et al., *Japanese Journal of Applied Physics*, Vol. 28, No 10, pp. L1809–L1811 (October 1989), using molecular beam epitaxy techniques with shutter control, while Fujita et al., *Applied Physics Letters*, Vol. 56, No. 3, pp. 295–297 (Jan. 15, 1990), disclose the preparation of superconducting compounds of the formula $Bi_2(Sr-Ca)_3Cu_2O_x$ by epitaxial growth techniques employing ion beam sputtering with an atomic oxygen source.

Although it is believed that a reduction in the number of Bi atoms per unit cell of the crystal structure in known Bi-Sr-Ca-Cu—O superconducting compounds would increase the conductivity of such compounds, attempts to synthesize $Bi_1Sr_2Ca_{n-1}Cu_nO_x$ materials, largely inspired by the discovery of $Tl_1Bl_2Ca_3Cu_4O_x$ compounds, have failed. Prior to the present Invention, it has generally been believed that such compounds are unstable and therefore impossible to form.

SUMMARY OF THE INVENTION

Accordingly, it is an object of the present Invention to provide novel Bi-Sr-Ca-Cu—O compounds which contain fewer Bi atoms per unit cell of the crystal structure as compared with previously known compositions. It is a further object to provide novel Bi-Sr-Ca-Cu—O compounds which are stable for practical purposes and which exhibit high temperature superconducting properties. It is a further object of the Invention to provide high quality thin superconducting films formed of the novel compounds.

These and additional objects are provided by the compounds of the present Invention which are of the formula $Bi_1Sr_2Ca_{n-1}Cu_nO_{2n+3+x}$ wherein n is a positive integer and x is less than 1. The compounds of the present Invention have a unit cell molecular configuration comprising a plurality of atomic layers arranged in the following sequence of compositions:

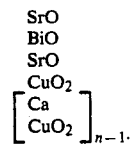

Each atomic layer has a thickness equal to that of the atoms which constitute the layer. The compounds of the present Invention are prepared by depositing a plurality of atomic layers on a substrate by molecular beam epitaxy, wherein the layers are in the above composition sequence, repeated a number of times. The compounds of the Invention are stable for practical purposes and have less valence electrons and higher carrier concentration as compared with previously known analogs having two Bi atoms per unit cell of the crystal structure. The compounds of the Invention exhibit high temperature superconducting properties.

These and additional objects and advantages will be more fully understood in view of the following detailed description.

BRIEF DESCRIPTION OF THE DRAWING

The drawing comprises a single Figure which is a schematic diagram of a modified molecular beam epitaxy growth chamber for use in forming the compounds of the present Invention.

DETAILED DESCRIPTION

The novel Bi-Sr-Ca-Cu—O compounds of the present Invention are of the formula $Bi_1Sr_2Ca_{n-1}Cu_nO_{2n+3+x}$ wherein n is a positive integer and x is less than 1. In a preferred embodiment, n is at least 2 wherein the compound comprises calcium, and in a more preferred embodiment, n is 3, 4 or 5. Included within this formula are compounds which depart slightly from ideal stoichiometry, including for example compounds of the formula $Bi_{0.9}Sr_{1.8}Ca_{2.9}Cu_4O_{11+x}$ and the like. Also included within this formula are compounds which include small quantities of dopants, for example Pb or Sn, or in which one or more of the cations are replaced by their analogs, for example in which a portion of the Sr is replaced by Ba or a portion of the Ca is replaced by Sr, and the like. As long as the overall crystal structure of the compound of the recited formula is unaffected by such doping or cation replacement, such compounds are within the scope of the recited formula.

The novel compounds according to the present Invention exhibit superconducting properties at temperatures of at least 77K, and therefore may be referred to as high temperature superconductors. It is generally known that a relatively high hole or carrier concentration is an important prerequisite in order for a material to exhibit a high superconducting transition temperature, $T_c$. It is believed that an optimal hole concentration, $n_h$, is approximately 0.2 holes per $CuO_2$ unit. In practice, however, such a hole concentration has been difficult to achieve in the previously known compounds of the formula $Bi_2Sr_2Ca_{n-1}Cu_nO_{2n+4+x}$ wherein n is at least 3, owing to an increasing tendency for oxygen-vacancy formation. The novel compounds of the present invention of the formula $Bi_1Sr_2Ca_{n-1}Cu_nO_{2n+3+x}$ have less valence electrons and a higher number of holes for the same value of x as compared with the analogs having two Bi atoms per unit cell of the crystal structure. For example, the compound of the present Invention wherein n is 4 and of the formula $Bi_1Sr_2Ca_3Cu_4O_{11}$ has 21 electrons and 22 relevant available states, and therefore, one hole per cell unit. Since the unit cell has four $CuO_2$ units, $n_h$ is 0.25 holes per $CuO_2$ unit. However, oxygen deficiency decreases $n_h$ further towards the optimal value of $n_h$ of 0.2, thereby providing a high superconducting transition temperature $T_c$.

The compounds according to the present Invention are layered perovskite cuprates and have a unit cell molecular configuration comprising a plurality of atomic layers arranged in the following sequence of compositions:

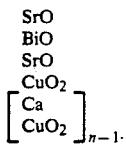

This sequence represents one unit cell of the compound of the formula $Bi_1Sr_2Ca_{n-1}Cu_nO_{2n+3+x}$. Thus, when n equals 3, 4 and 5, the respective compounds according to the present Invention have unit cells comprising the following sequences of atomic layers:

| n = 3 | n = 4 | n = 5 |
|-------|-------|-------|
| SrO | SrO | SrO |
| BiO | BiO | BiO |
| SrO | SrO | SrO |
| $CuO_2$ | $CuO_2$ | $CuO_2$ |
| Ca | Ca | Ca |
| $CuO_2$ | $CuO_2$ | $CuO_2$ |
| Ca | Ca | Ca |
| $CuO_2$ | $CuO_2$ | $CuO_2$ |
|  | Ca | Ca |
|  | $CuO_2$ | $CuO_2$ |
|  |  | Ca |
|  |  | $CuO_2$ |

Each atomic layer has a thickness equal to that of the atoms which constitute the layer. The novel compounds according to the present Invention are formed by atomic layer molecular beam epitaxy. More specifically, the compounds of the present Invention have been prepared by modified molecular beam epitaxy (MBE) using a growth system similar to that described by Eckstein et al, supra. The growth system is shown schematically in the present Figure. With reference to the Figure, the MBE growth system includes a growth chamber 10 provided with a substrate holder 12 for positioning a substrate 14 during the deposition process. Preferably, but not necessarily, the substrate comprises a $SrTiO_3$ wafer in order to achieve lattice matching with the deposited compound. As shown in the Figure, the substrate holder 12 is also provided with an ionization gauge 16 and is rotatable so that the ionization gauge may be rotated to the deposition position. The growth chamber set forth in the Figure also includes a plurality of source furnaces 18a, 18b, 18c and 18d which in the formation of the novel compounds of the present Invention are supplied with calcium, copper, bismuth and strontium, respectively. The source furnaces comprise standard molecular beam epitaxy (MBE) cells placed in ports equipped with individual beam shutters. The opening and closing of the individual beam shutters are controlled by a computer (not shown).

Oxygen is supplied to the growth chamber in the form of an ozone beam 20 from an inlet valve 22 from any suitable source. In the embodiment shown schematically in the Figure, an ozone generator 24 is provided for generating ozone from an oxygen source 26. The growth chamber 10 may be further provided with a turbo pump 28 to pump the ozone mass flow, a reflection high energy electron diffraction (RHEED) gun 29 and screen 30 for monitoring crystal structure during molecular beam epitaxy and additional apparatus, for example a mass spectrometer 32, for characterizing the deposited films when growth is complete.

In the growth system shown schematically in the Figure, the beam flux from each source may be separately measured prior to and after growth by rotating the ionization gauge 16 into the growth position and noting the pressure change occurring when the shutter of each source is opened and closed. The resulting beam pressure readings may be converted to relative beam fluxes by means of a set of coefficients obtained from the analysis of many samples using Rutherford backscattering spectrometry to determine compositions. Thus, the ionization gauge may be used to determine when the formation of each atomic layer is complete.

As noted previously, a predetermined sequence of monolayers is deposited to form the unit cell crystal structure of the novel compounds of the present Invention. While the ozone beam is directed at the substrate's surface, the shutter of the strontium source is opened and a first SrO atomic layer is deposited. When the deposition of this layer is complete, the shutter for the strontium source is closed and the shutter for the bismuth source is opened. A BiO atomic layer is then deposited on the SrO layer. At the completion of the formation of the BiO atomic layer, the shutter on the bismuth source is closed and the shutter on the strontium source is reopened so that a further SrO atomic layer may be deposited on the BiO layer. The shutter on the strontium source is then closed and the shutter on the copper source is opened to allow deposition of a $CuO_2$ atomic layer. Upon completion of formation of the $CuO_2$ atomic layer, the shutter on the copper source is closed and the shutter on the calcium source is opened allowing deposition of a Ca atomic layer on the $CuO_2$ atomic layer. Upon completion of formation of the Ca atomic layer, the shutter on the calcium source is closed and the shutter on the copper source is reopened to allow deposition of a further $CuO_2$ atomic layer. As noted above, the shutters and source furnace activation are computer controlled (computer is not shown in the Figure). The sequence of atomic layers resulting from this described deposition results in the formation of a compound of the formula $Bi_1Sr_2Ca_1Cu_2O_{7+x}$. In order to provide compounds of the formula $Bi_1Sr_2Ca_{n-1}Cu_nO_{2n+s+x}$ wherein n is greater than 2, the sequence of depositions described above is followed by repeated depositions of a Ca atomic layer and a $CuO_2$ atomic layer in order to provide n−1 Ca atomic layers and n $CuO_2$ layers per unit cell of the crystal structure. The sequence of atomic layers which constitutes the unit cell for a compound of the formula $Bi_1Sr_2Ca_{n-1}Cu_nO_{2n+3+x}$ may be deposited a plurality of times in order to provide a high quality thin superconducting film of a desired thickness.

During the molecular beam epitaxy, the $SrTiO_3$ wafer substrate is heated to a temperature in the range of from around 650° C. to about 700° C. If the substrate temperature is less than about 625° C., the deposited atoms do not have sufficient surface mobility. On the other hand, if the substrate temperature is greater than about 700° C., excessive bulk diffusion occurs whereby the atoms may not remain in the correct positions.

It is further preferred that the molecular beam epitaxy be conducted using a background pressure in the range of from about $5 \times 10^{-6}$ to $2 \times 10^{-4}$ Torr, and more preferably at a pressure of about $1 \times 10^{-5}$ Torr. As may be apparent, the pressure at the substrate may be significantly higher, for example 5 to 10 times higher, than the background pressure owing to differential pumping.

As noted above, an important feature in producing the compounds of the present Invention comprises the atomic layer by layer molecular beam epitaxial deposition of the disclosed sequence of compositions. The atomic beams employed in the deposition may be generated by any means known in the art including sputtering, laser ablation and thermal evaporation.

In preparing a thin film of the novel compounds according to the present Invention, the material deposited by molecular beam epitaxy may be annealed at a temperature of about 700° C. for a short period of time, for example, several minutes or more. This annealing may improve the crystal structure of the deposited material. Additionally, after annealing the deposited material, additional sequences of atomic layers forming a unit cell may be deposited on the annealed material by the molecular beam epitaxial techniques discussed above in order to produce a film of a desired thickness. The resulting material, including the newly deposited layers may be subjected to further annealing, if desired, for example at a temperature of about 700° C.

The compounds and methods of the present Invention are illustrated by the following example.

EXAMPLE

A growth system similar to that shown in the Figure was employed to produce compounds according to the present Invention. A $SrTiO_3$ wafer substrate was heated to a temperature in the range of 650° C. to 700° C. and the background pressure employed in the growth system was about $1 \times 10^{-5}$ Torr. A continuous flow of ozone was directed to the growth chamber while the shutters for the source furnaces containing bismuth, strontium, calcium and copper were alternately opened and closed in order to deposit by molecular beam epitaxy a plurality of atomic layers on the wafer substrate. Samples of both $Bi_1Sr_2Ca_4Cu_5O_{13+x}$ and $Bi_1Sr_2Ca_2Cu_3O_{9+x}$ were formed. The samples were subjected to various analysis techniques in order to confirm their structure and superconducting properties.

This example is set forth to illustrate specific embodiments of the Invention and is not intended to limit the scope of the compounds and methods of the present Invention. Additional embodiments and advantages within the scope of the claimed Invention will be apparent to one of ordinary skill in the art.

What is claimed is:

1. A compound of the formula $$Bi_1Sr_2Ca_{n-1}Cu_nO_{2n+3+x}$$

wherein n is a positive integer of up to 5 and x is less than 1, said compound having a unit cell molecular configuration comprising a plurality of atomic layers arranged in the following sequence of compositions:

SrO
BiO
SrO
$\begin{bmatrix} CuO_2 \\ Ca \\ CuO_2 \end{bmatrix}_{n-1}.$

2. A compound as defined by claim 1, wherein n is at least 2.

3. A compound as defined by claim 1, wherein n is 3, 4 or 5.

4. A compound as defined by claim 1, wherein n equals 3 and having a unit cell molecular configuration comprising a plurality of atomic layers arranged in the following sequence of compositions:

SrO

BiO

SrO $CuO_2$

Ca $CuO_2$

Ca $CuO_2$.

5. A compound as defined by claim 1, wherein n equals 4 and having a unit cell molecular configuration comprising a plurality of atomic layers arranged in the following sequence of compositions:

SrO

BiO

SrO $CuO_2$

Ca $CuO_2$

Ca $CuO_2$

Ca $CuO_2$.

6. A compound as defined by claim 1, wherein n equals 5 and having a unit cell molecular configuration comprising a plurality of atomic layers arranged in the following sequence of compositions:

SrO

BiO

SrO $CuO_2$

Ca $CuO_2$

Ca $CuO_2$

Ca $CuO_2$

Ca $CuO_2$.

7. A compound as defined by claim 1, wherein a portion of the Sr is replaced with Ba.

8. A compound as defined by claim 1, wherein a portion of the Ca is replaced with Sr.

9. A compound as defined by claim 1, wherein at least one dopant is included therein.

* * * * *